United States Patent [19]

Drake et al.

[11] Patent Number: 5,045,142
[45] Date of Patent: Sep. 3, 1991

[54] STAND-OFF STRUCTURE FOR FLIPPED CHIP BUTTING

[75] Inventors: Donald J. Drake; Cathie Burke, both of Rochester, N.Y.

[73] Assignee: Xerox Corporation, N.Y.

[21] Appl. No.: 440,269

[22] Filed: Nov. 22, 1989

[51] Int. Cl.[5] .............................................. B32B 31/00
[52] U.S. Cl. .................................... 156/278; 29/467; 29/832; 156/241; 156/281; 156/297; 156/304.3; 437/209
[58] Field of Search ............... 156/278, 297, 241, 281, 156/304.3; 29/467, 832; 437/209

[56] References Cited

U.S. PATENT DOCUMENTS

| | | | |
|---|---|---|---|
| 4,184,043 | 1/1980 | Hildering | 437/209 |
| 4,466,181 | 8/1984 | Takishima . | |
| 4,622,574 | 11/1986 | Garcia . | |
| 4,690,391 | 9/1987 | Stoffel et al. . | |
| 4,723,197 | 2/1988 | Takiar et al. . | |

OTHER PUBLICATIONS

Miller, IBM Technical Disclosure Bulletin, "Microelectronic Device Standoffs", vol. 8, No. 3, Aug. 1965, p. 380.

Primary Examiner—John J. Gallagher
Attorney, Agent, or Firm—Oliff & Berridge

[57] ABSTRACT

A pagewidth array is fabricated to include a plurality of heating element subunits of the same or differing thicknesses, each subunit having a circuit surface and an opposite base surface. The plurality of subunits is inverted with each of the circuit surfaces facing toward a support surface to expose the base surfaces of each subunit. Each of said subunits is butted against an adjacent subunit to form an end-to-end array of butted subunits, and a conformal adhesive is applied to a bonding substrate which is then applied to the base surfaces of the array of butted substrates to form a coplanar adhesive layer across each of said subunits. The circuit surfaces are protected from damage due to contact with said support surface by applying a stand-off layer of substantially uniform thickness to at least a portion of the circuit surfaces prior to inverting the plurality of subunits. The stand-off layer preferably is polyimide.

16 Claims, 5 Drawing Sheets

STAND-OFF STRUCTURE FOR FLIPPED CHIP BUTTING

BACKGROUND OF THE INVENTION

1. Field of the Invention

The present invention relates to methods of forming extended arrays of silicon wafer subunits, and more particularly to methods of forming pagewidth arrays by butting multiple print-head subunits into an extended array.

2. Description of Relate

Two preferred methods of forming the butt edges on a subunit are sawing through a silicon wafer or anisotropically etching through a wafer to form subunits having butt edges. Since the step of separating a wafer into subunits by sawing or etching is performed as a batch, well prior to the step of aligning the subunits into arrays, the latter step usually involves selecting subunits from a bin which contains subunits having a variety of thicknesses. For vertical butt edges, $B_1$, $B_2$ (FIG. 1A), each subunit $S_1$ may have a thickness different from the adjacent subunit $S_2$, thus creating a height difference $\Delta h$ between adjacent subunits which forms a step between the integrated circuit IC1 on the circuit surface CS1 of one subunit and the integrated circuit IC2 on the circuit surface CS2 of the adjacent subunit $S_2$. A benefit of etching is that it does not cause cracking of the silicon wafer passivation layer associated with sawing. Etching, however, forms wafer subunits having diagonal butt edges because the etching occurs along (111) planes of the silicon wafer. When the subunits are formed via etching with diagonal butt edges, $B_1$, $B_2$ (FIG. 1B), height h between adjacent silicon subunits $S_1$, $S_2$ results in a lateral shift equal to 0.7 $\Delta h$ of the circuit surfaces CS1, CS2 of these subunits. These displacements are often unacceptable.

In order to overcome the problem of lateral shifting caused by height differences $\Delta h$ between adjacent chips, it has been suggested that adjacent subunit chips can be butted in a flipped orientation (with the integrated circuit facing downwardly). This solves the problem of height differences but requires the delicate circuitry to contact and be moved along a support substrate during the butting procedure. Damage to the integrated circuits, especially the passivation layer, is a possibility. For example, see U.S. Pat. No. 4,690,391 to Stoffel for its disclosure of flipped-chip butting for alignment purposes.

U.S. Pat. No. 4,466,181 to Takashima discloses a method of manufacturing a semiconductive device by positioning plural semiconductive chips on a film so that one of the surfaces of the chips forms a flat plane and connecting the semiconductive chips to one another by applying an insulative material between the chips. The chips are not butted against one another and consequently the problems associated with lateral displacement are not addressed by Takashima. Although the insulative material can be polyimide it is only applied between the chips and not onto the integrated circuit surface of the chip. The conjoined chips of Takashima are not bonded to a substrate and do not form a pagewidth array.

U.S. Pat. No. 4,723,197 to Takiar et al discloses a semiconductor device including a substrate having a surface upon which is located at least one metallization pad, a polyimide layer over the surface, a puncture resistant layer over the polyimide layer and a metal interconnection which penetrates the polyimide layer and the puncture resistant layer to connect with the metallization pad. Although the polyimide layer is used to protect the circuit elements, the present invention is not taught or suggested. The polyimide layer is not applied with a substantially uniform thickness to the circuit surface.

U.S. Pat. No. 4,622,574 to Garcia discloses a semiconductor chip having an upper circuit surface and a peripheral ledge which is recessed below the circuit surface for containing at least one bond pad, and a method of making same. Garcia also discloses a method of fabricating a semiconductor chip from a silicon wafer by forming a groove in the wafer and cutting the wafer within the groove. The present invention is not taught or suggested by Garcia.

OBJECTS OF THE INVENTION

An object of the present invention is to provide a method of fabricating arrays of silicon wafer subunits so that differences in height of adjacent subunits do not cause lateral displacements, or height differences between adjacent subunits.

Another object of the present invention is to provide a method of fabricating arrays of silicon wafer subunits by inverting the subunits so that a circuit surface of the subunit faces downwardly during butting without damaging the circuit surface of the wafer subunit.

A further object of the present invention is to provide a method of fabricating pagewidth arrays which include a plurality of butted subunits of differing thicknesses while compensating for the differing thicknesses.

SUMMARY OF THE INVENTION

In accordance with the present invention, there is provided a method of fabricating an array of silicon wafer subunits, each subunit having a circuit surface, an opposite base surface and differing thicknesses. The method comprises:

Inverting the plurality of subunits with each of said circuit surfaces facing toward a support surface to expose the base surfaces of each subunit;

Butting each of said subunits against an adjacent subunit to form an end-to-end array of butted subunits;

Applying a conformal adhesive to a bonding substrate and attaching the bonding substrate to the base surfaces of said array of butted substrates to form a substantially coplanar adhesive layer across each of said subunits;

Permitting said adhesive layer to cure to form an extended array of subunits; and Protecting the circuit surfaces of the subunits from damage due to contact with the support surface by applying a stand-off layer of substantially uniform thickness to at least a portion of the circuit surfaces prior to inverting the plurality of subunits.

BRIEF DESCRIPTION OF THE DRAWINGS

The invention will be described in detail with reference to the following drawings wherein.

DETAILED DESCRIPTION OF THE PREFERRED EMBODIMENTS

Figure 1A:
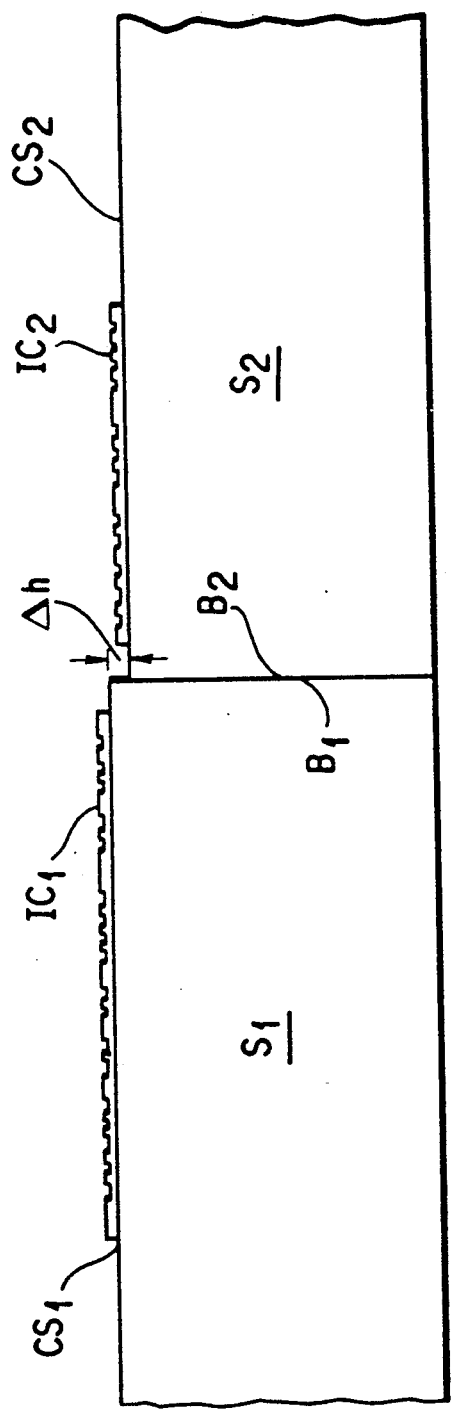
FIGS. 1A-1B are cross-sectional views showing wafer subunits having different thicknesses butted against one another.
Figure 1B:
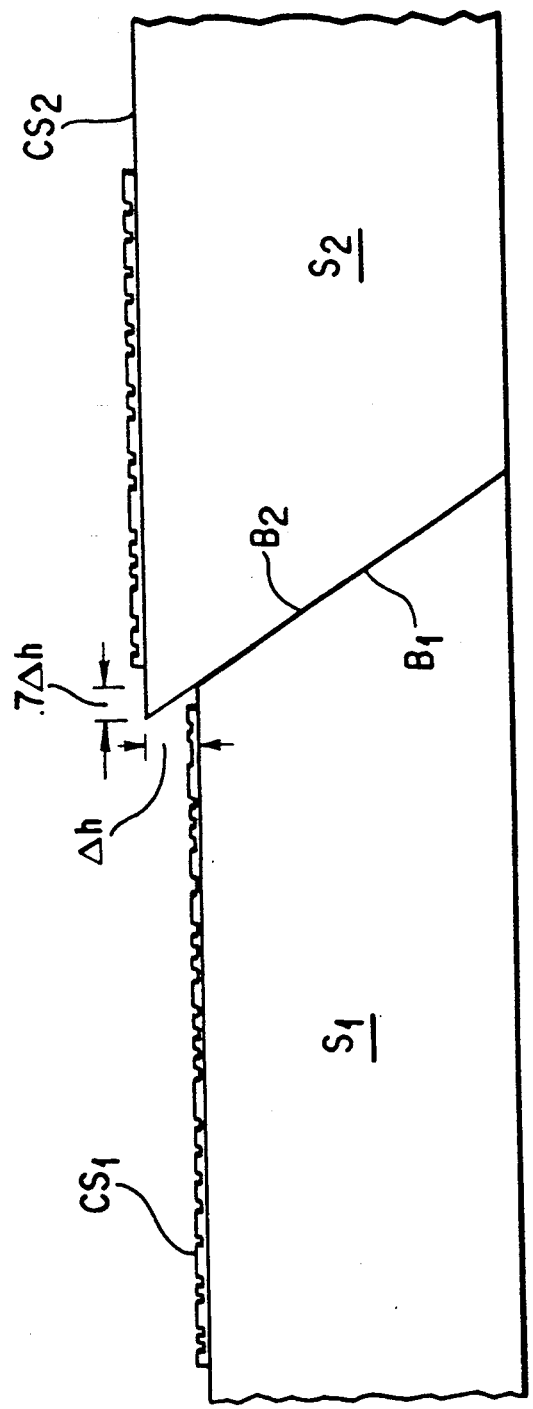

The present invention will now be described in detail by way of preferred embodiments of the manufacturing method referred to in the drawings. The present invention is applicable to any fabrication process involving butting of wafer subunits into extended arrays. The present invention is particularly desirable for forming RIS and ROS bars since they have integrated circuitry on one surface and are very sensitive to misalignments caused by butting chips of differing thicknesses into arrays.

Figure 2:
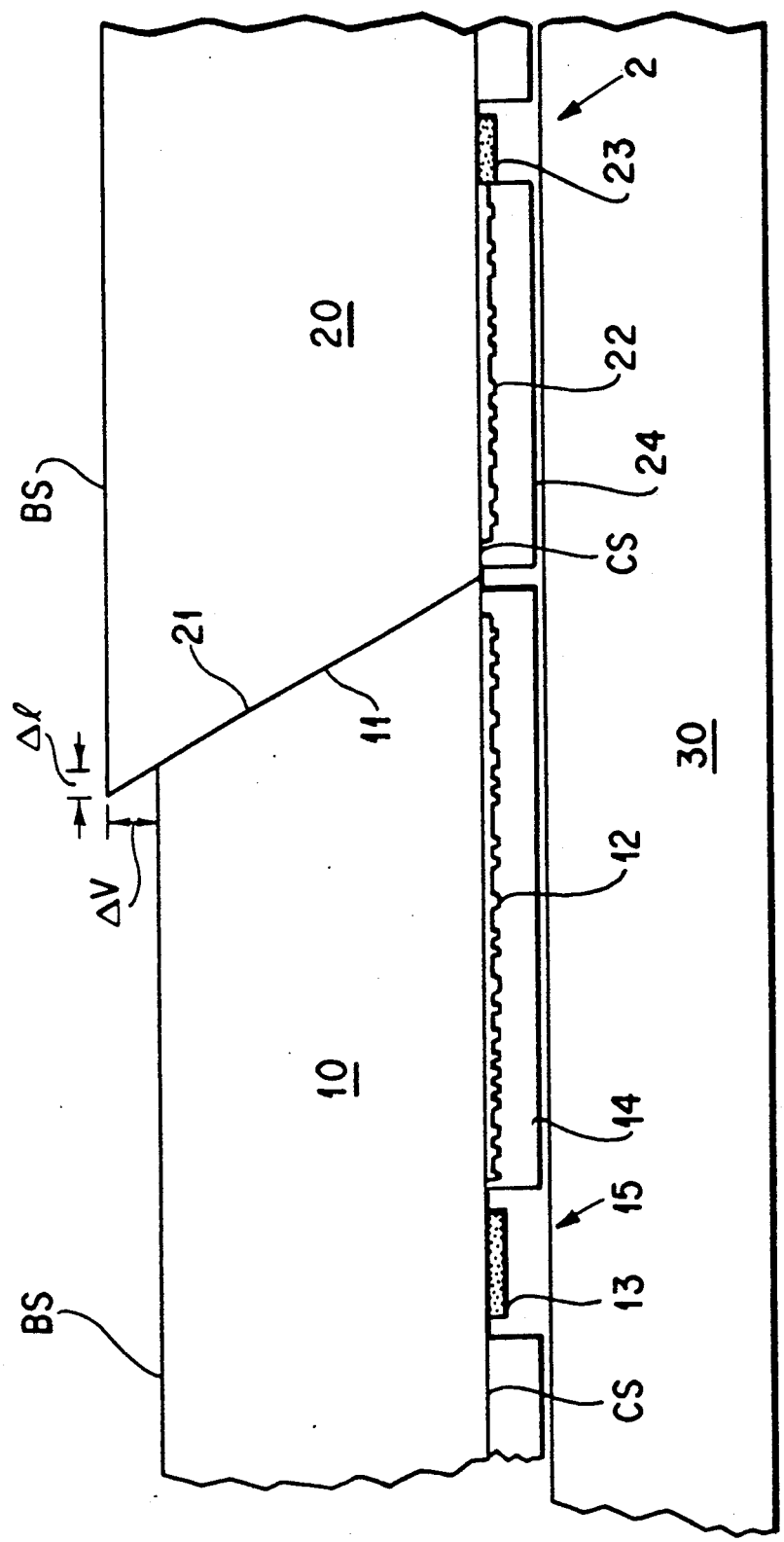
FIG. 2 is a cross-sectional view of two inverted chips having a standoff layer applied to their circuit surfaces which are butted against one another at their butt edges.

FIG. 2 shows, generally, two inverted chips or subunits 10 and 20 which are butted against one another at their butt edges 11 and 21. The chips each have a circuit surface CS containing an integrated circuit 12, 22 having a bonding pad 13, 23 associated therewith. The circuit could be, e.g., an array of heating elements in the case of a thermal ink jet printhead, or photosites and associated circuitry in the case of a scanning array. By inverting the chips so that the circuit surfaces CS face downwardly against a butting jig substrate 30, the chips 10, 20 can be butted against one another in such a way that the circuit surfaces CS are coplanar, i.e., any difference in thickness between the chips does not cause a vertical $\Delta v$ or lateral $\Delta l$ displacement on the circuit surfaces of the chips. Such displacements are evident on the base surfaces BS of the chips. Thus, the present invention enables chips of different thicknesses to be butted to one another with their circuit surfaces being coplanar. The integrated circuits 12, 22 are protected from damage due to contact with the butting jig substrate 30 by application of a stand off layer 14, 24 over the circuit surfaces CS prior to inverting the chips. The stand off layers 14, 24 include bonding pad vias 15, 25 which permit wire attachment to the bonding pads 13, 23. The standoff layer is photopatternable so that a portion thereof can be removed to form the vias 15, 25.

FIG. 2 illustrates that almost the entire circuit surface (except for the contact pad vias) is covered with the stand off layer. However, for circuit protection, only a portion of the circuit surface needs to include the stand off layer. For example, the stand off layer can be photopatterned to define two skids (see FIG. 5) which support the subunit and raise the circuit surface off the butting jig substrate. Also, as discussed with reference to FIG. 5, the shape of the stand off layer can be employed as a key for alignment with a corresponding key-way structure to precisely locate the chip.

Figure 3:
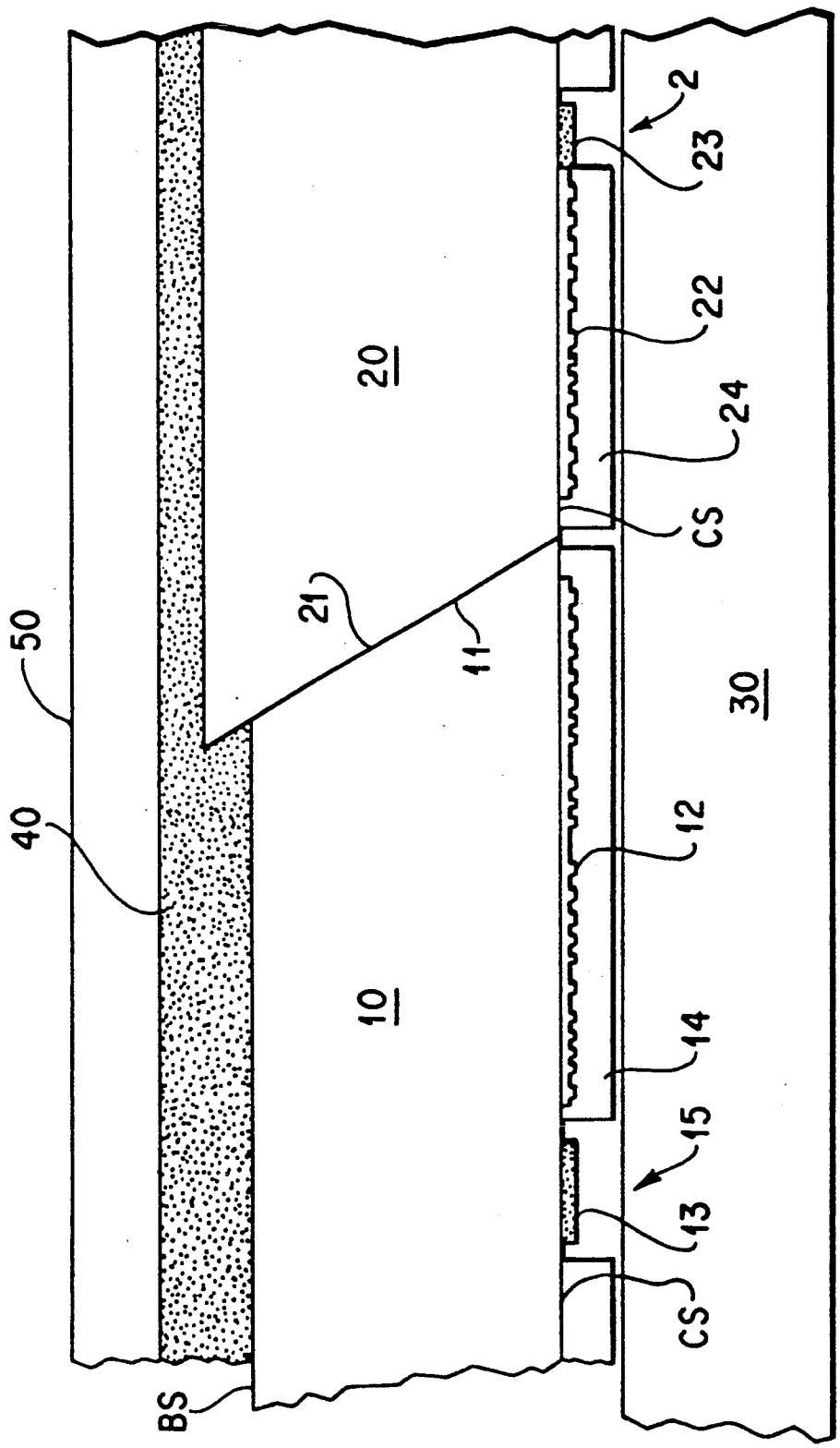
FIG. 3 is a cross-sectional view of two inverted chips after a further fabrication step is performed.

FIG. 3 shows the inverted chips 10 and 20 after a further fabrication step is performed. In this step, a layer of a conformal adhesive 40 (such as EPOTEK H20E) is applied to a bonding substrate 50, e.g., a pagewidth bar, which is then applied to the base surfaces BS of the array of butted substrates to form a coplanar adhesive layer 40 across each of the subunits 10, 20. The adhesive layer is then permitted to cure to form an integral assembly. It is noted that the stand-off layer 14, 24 continues to protect the circuit surface during the operation.

Figure 4:
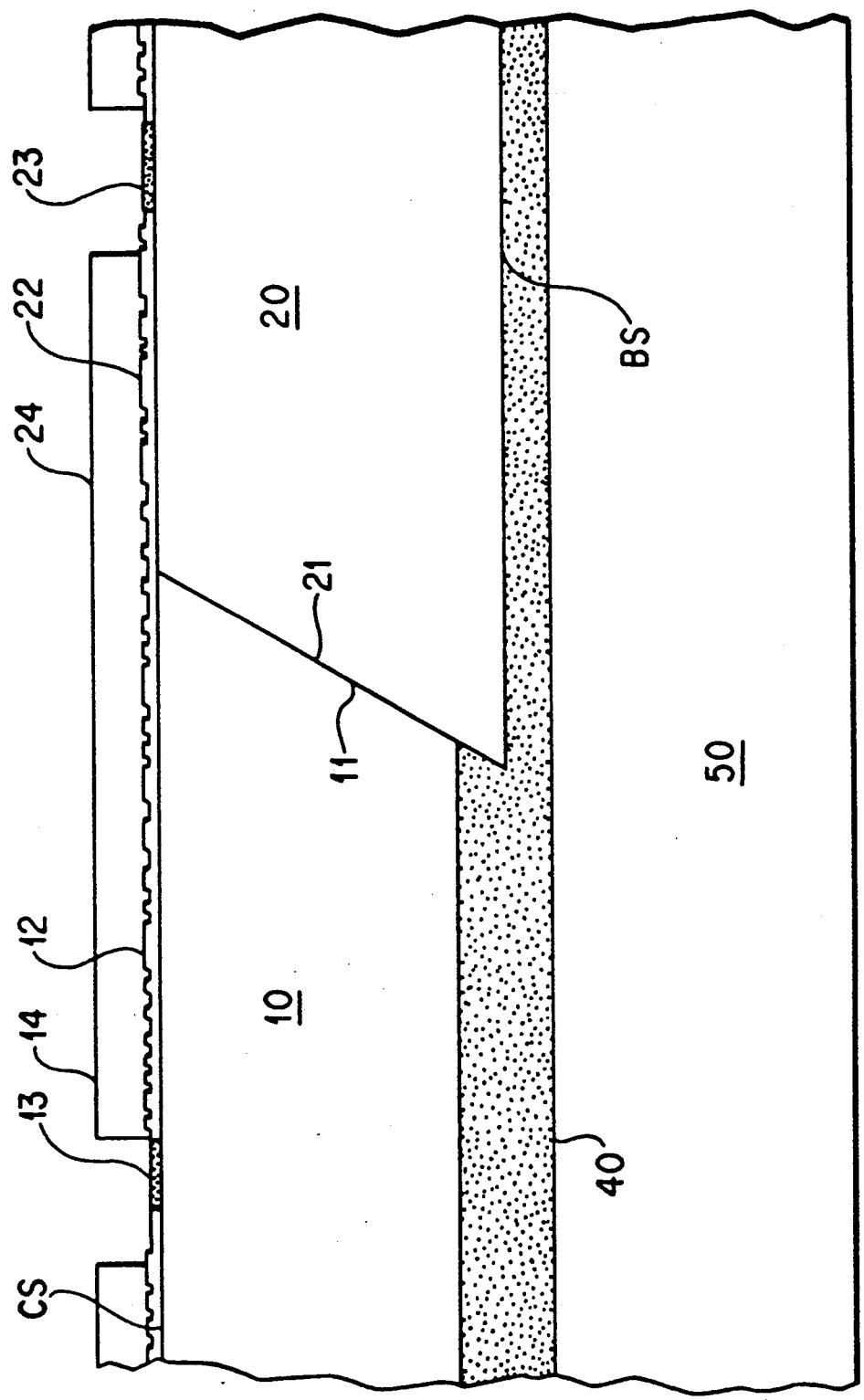
FIG. 4 is a cross-sectional view of a completed structure made by the method of the present invention.

FIG. 4 shows a completed structure after re-inversion to locate the circuit surface CS above the base surface BS. The completed structure includes the bonding substrate 50, conformal adhesive layer 40, wafer subunit 10 and 20, stand-off layer 14, 24 and bonding pad vias 15, 25. As demonstrated by FIG. 4, any differences in thickness between adjacent wafer subunits are expressed on the base surfaces BS of the subunits and compensated for by the conformal adhesive layer 40. The circuit surfaces of adjacent subunits are not laterally displaced from one another and as long as the locations of the butt edges relative to the circuits on the circuit surface of the subunits can be accurately controlled, a uniform array of circuits contained on wafer subunits can be produced. The circuit on the circuit surfaces are protected from damage during the assembly process by the stand-off layer.

The standoff layer 14, 24 is formed on the circuit surface CS having a thickness of between 2 and 100 micrometers and preferably 5 micrometers. The standoff layer 14, 24 is photolithographically processed to enable etching and removal of those portions of the layer over each heating element and electrode terminal. Thus, kthe standoff layer 14, 24 covers the circuit surface of the wafer subunits except for the bonding pads 13, 23 and provides passivation and mechanical protection ;for the integrated circuitry. While a preferred material is polyimide, there are many other suitable films that can be used such as DUPONT VACREL. The stand-off layer can be, e.g., a photopatternable polyimide. The thickness uniformity of this material can be in the neighborhood of ±0.5 micrometers.

Figure 5:
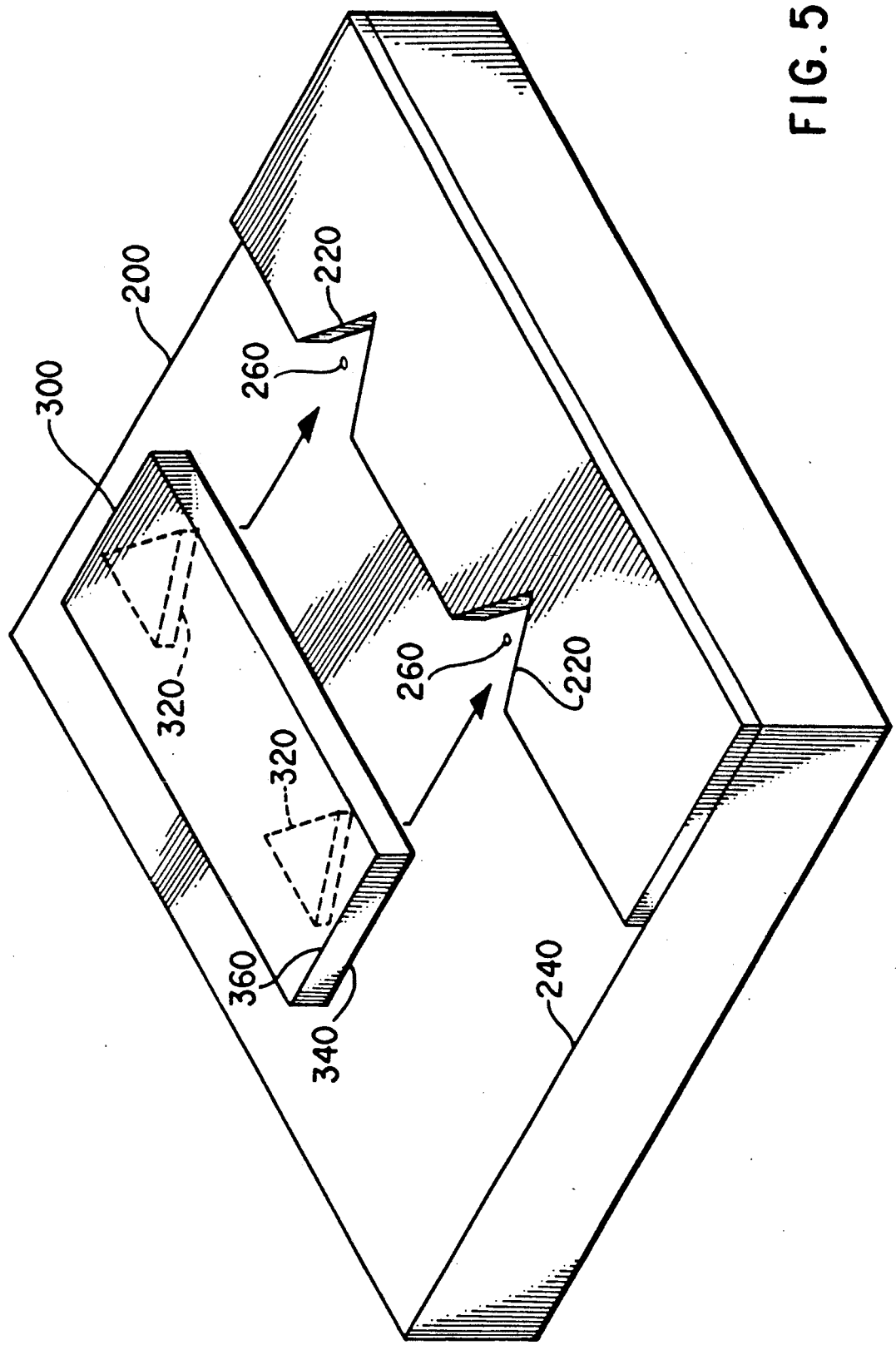
FIG. 5 is a perspective view of a chip where the stand off layer is formed as a skid or key to serve the dual purpose of protecting the circuitry and facilitating alignment.

As illustrated in FIG. 5, the stand off layer can be formed on the subunit 300 as keys or skids 320 located on the circuit surface 360 of the subunit 340. The keys 320 can then mate with corresponding keyways 220 on the upper surface 240 of an alignment substrate 200 which may include vacuum holes 260 for holding the subunit 300 in place. The keys then serve the dual purpose of an alignment structure and a protective structure. The keys 320 can be formed by photopatterning the stand off layer to form the keys 320. Such keys can be provided in the form of stand-off layers or single chips or on an end-to-end array which in a plurality of wafer subunits butted to one another. A more detailed discussion of keyway structures is provided in U.S. patent Ser. No. 401,379 filed Aug. 31, 1989, the disclosure of which is herein incorporated by reference.

It is understood that the present invention is applicable to any type of array, RIS or ROS bars requiring a series of circuit containing subunits to be butted together to form an array of subunits where a preferred method of butting includes placement of the circuit surfaces of the subunits on a substrate.

The method of the present invention also is applicable to any fabrication process involving butting of wafer subunits (or chips) to form extended arrays wherein the surface of the subunit which is most optimal for facing downwardly during the butting procedure is prone to damage due to contact with a butting jig substrate. Thus, the present invention permits butt edges to be formed entirely by anisotropic etching because no lateral displacement of the integrated circuit surfaces of adjacent wafer subunits will occur. Alternatively, the butt edges can be formed by dicing.

The invention has been described in detail with reference to the preferred embodiments thereof, which are intended to be illustrative and not limiting. Various changes may be made without departing from the spirit and scope of the invention as defined in the following claims.

WHAT IS CLAIMED IS:

1. A method of fabricating a pagewidth array which includes a plurality of wafer subunits, each subunit having a circuit surface and an opposite base surface, said method comprising the steps of:

inverting said plurality of subunits with each of said circuit surfaces facing toward a support surface to expose the base surfaces of each subunit;

butting each of said subunits against an adjacent subunit to form an end-to-end array of butted subunits;

applying a conformal adhesive to a bonding substrate, and applying the bonding substrate to the base surfaces of said array of butted subunits to form an adhesive layer across each of said subunits;

permitting said adhesive layer to cure to form an assembly; and protecting said circuit surfaces from damage due to contact with said support surface by applying a stand-off layer of substantially uniform thickness to at least a portion of said circuit surfaces prior to inverting said plurality of subunits.

2. The method of claim 1 wherein the circuit surfaces of each subunit are coplanar after application of the stand-off layer and inversion onto said support surface.

3. The method of claim 1 wherein the step of protecting the circuit surfaces by applying a stand-off layer includes the step of patterning the stand-off layer to expose circuit bonding pads on the circuit surface.

4. The method of claim 1 wherein the stand-off layer comprises polyimide.

5. The method of claim 1 wherein the stand-off layer has a thickness in the range of 2 to 100 $\mu$m.

6. The method of claim 5 wherein the stand-off layer has a thickness of about 5 $\mu$m.

7. The method of claim 1 wherein the stand off layer is applied to predetermined portions of the circuit surface of the array to form keys for alignment with a corresponding keyway structure.

8. A method of fabricating an extended array of wafer subunits which includes a plurality of wafer subunits, each subunit having a circuit surface and an opposite base surface, said method comprising the steps of:

inverting said plurality of subunits with each of said circuit surfaces facing toward a support surface to expose the base surfaces of each subunit;

butting each of said subunits against an adjacent subunit to form an end-to-end array of butted subunits;

applying a conformal adhesive to a bonding substrate, and applying the bonding substrate to the base surfaces of said array of butted substrates to form an adhesive layer across each of said subunits;

permitting said adhesive layer to cure to form an extended array of subunits; and protecting said circuit surfaces from damage due to contact with said support surface by applying a stand-off layer of substantially uniform thickness to at least a portion of said circuit surfaces prior to inverting said plurality of subunits.

9. The method of claim 8 wherein the circuit surfaces of each subunit are coplanar after application of the stand-off layer and inversion onto said support surface.

10. The method of claim 8 wherein the step of protecting the circuit surfaces by applying a stand-off layer includes the step of patterning the stand-off layer to expose circuit bonding pads on the circuit surface.

11. The method of claim 8 wherein the stand-off layer comprises polyimide.

12. The method of claim 8 wherein the stand-off layer has a thickness in the range of 2 to 100 $\mu$m.

13. The method of claim 12 wherein the stand-off layer has a thickness of about 5 $\mu$m.

14. The method according to claim 8 wherein the stand-off layer is applied to predetermined portions of the circuit surface of the array to form keys for alignment with a corresponding keyway structure.

15. The method according to claim 1, wherein said plurality of wafer subunits are of differing thicknesses.

16. The method of claim 8, wherein said plurality of wafer subunits are of differing thicknesses.

* * * * *